US008222946B2

(12) United States Patent
Feng

(10) Patent No.: US 8,222,946 B2
(45) Date of Patent: Jul. 17, 2012

(54) CAPACITIVE TOUCHING APPARATUS

(75) Inventor: Foma Feng, Taoyuan County (TW)

(73) Assignee: Holtek Semicondutor Inc., Hsinchu (TW)

( * ) Notice: Subject to any disclaimer, the term of this patent is extended or adjusted under 35 U.S.C. 154(b) by 159 days.

(21) Appl. No.: 12/857,592

(22) Filed: Aug. 17, 2010

(65) Prior Publication Data
US 2012/0001678 A1    Jan. 5, 2012

(30) Foreign Application Priority Data

Jun. 30, 2010 (CN) .......................... 2010 1 0216657

(51) Int. Cl.
*G06F 7/64* (2006.01)
(52) U.S. Cl. ...................................... 327/337; 327/124
(58) Field of Classification Search .................. 327/124, 327/337
See application file for complete search history.

(56) References Cited

U.S. PATENT DOCUMENTS

| | | | | |
|---|---|---|---|---|
| 4,639,720 A | * | 1/1987 | Rympalski et al. | 345/174 |
| 4,736,191 A | * | 4/1988 | Matzke et al. | 341/20 |
| 5,914,465 A | * | 6/1999 | Allen et al. | 178/18.06 |
| 6,452,514 B1 | | 9/2002 | Philipp | |
| 2009/0153152 A1 | | 6/2009 | Maharyta et al. | |
| 2009/0273573 A1 | | 11/2009 | Hotelling | |

* cited by examiner

*Primary Examiner* — Kenneth B. Wells
(74) *Attorney, Agent, or Firm* — Jianq Chyun IP Office

(57) ABSTRACT

The invention provides a capacitive touching apparatus, which includes at least an equivalent capacitor module, a first comparator, a first reference current generator, a first detection capacitor module and a selection switch module. The equivalent capacitor module receives a periodic driving signal and produces an output voltage according to the driving signal. The first comparator compares the output voltage with a first reference voltage and thereby produces a first comparison result. The first reference current generator produces a first reference current and a second reference current according to a base current, in which the first reference current generator decides whether to respectively output the first reference current and the second reference current according to the first comparison result, and the first reference current is output to the equivalent capacitor module. The first detection capacitor module produces a first detection output signal according to the second reference current.

21 Claims, 5 Drawing Sheets

US 8,222,946 B2

CAPACITIVE TOUCHING APPARATUS

CROSS-REFERENCE TO RELATED APPLICATION

This application claims the priority benefit of China application No. 201010216657.3, filed on Jun. 30, 2010. The entirety of the above-mentioned patent application is hereby incorporated by reference herein and made a part of this specification.

BACKGROUND OF THE INVENTION

1. Field of the Invention

The invention generally relates to a capacitive touching apparatus, and more particularly, to a capacitance variation detection circuit of a capacitive touching apparatus.

2. Description of Related Art

Along with the population of electronic technology, a very important function of the current electronic products is to provide an electronic apparatus able to produce a high interactivity with the user thereof, in which the touching panel techniques takes the first place to be the most effective one directly providing a man-machine interactive technique.

Touching apparatuses can be roughly divided into several types, for example, resistive touching apparatus, capacitive touching apparatus and projection touching apparatus. Taking a capacitive touching apparatus as an exemplary example, FIG. 1 is a circuit diagram of a conventional capacitive touching apparatus 100. Referring to FIG. 1, the capacitive touching apparatus 100 includes an integrator 110 connecting a plurality of touch capacitors 120-140 so as to detect the variation of the capacitance value thereof. When conducting detecting the variation of the capacitance value on one of the touch capacitors 120-140, a periodic oscillating signal IN is necessarily provided to the one of the touch capacitors 120-140. By means of the integrator 110, the voltage variations of the detected touch capacitors are obtained under applying a plurality of oscillating signals IN so as to detect the variations of the capacitance values of the touch capacitors to be detected.

SUMMARY OF THE INVENTION

Accordingly, the invention is respectively directed to two capacitive touching apparatuses able to effectively detect the variation of the capacitance of an equivalent capacitor module on the touching apparatus.

The invention provides a capacitive touching apparatus, which includes at least an equivalent capacitor module, a first comparator, a first reference current generator and a first detection capacitor module. The first terminal of the equivalent capacitor module receives a periodic driving signal, and an output voltage is produced at the second terminal of the equivalent capacitor module according to the driving signal. The first comparator is coupled to the equivalent capacitor module, receives the output voltage and compares the output voltage with a first reference voltage so as to produce a first comparison result. The first reference current generator is coupled to the equivalent capacitor module and the first comparator and produces a first reference current and a second reference current according to a base current, in which the first reference current generator decides whether to respectively output the first reference current and the second reference current according to the first comparison result, and the first reference current is output to the second terminal of the equivalent capacitor module. The first detection capacitor module is coupled to the first reference current generator to receive the second reference current and to thereby produce a first detection output signal.

The invention also provides another capacitive touching apparatus, which includes at least a touch capacitor, a charging current source, a first capacitor, a selection switch module, a comparator, a reference current generator and a detection capacitor module. The charging current source provides a charging current. The selection switch module is coupled between the touch capacitor and the charging current source for charging the first capacitor by using the charging current, making the touch capacitor coupled to a ground voltage so as to be discharged or making the first capacitor coupled to the touch capacitor for assigning charges according to a selection signal. The comparator is coupled to the first capacitor and the selection switch module and makes the result of assigning charge between the first capacitor and the touch capacitor compared with a reference voltage so as to produce a comparison result. The reference current generator is coupled to the comparator and the first capacitor so as to produce a first reference current and a second reference current according to a base current, in which the reference current generator decides whether to respectively output the first reference current and the second reference current according to the comparison result and a control signal, in which the first reference current is output to the first capacitor. The detection capacitor module is coupled to the reference current generator to receive the second reference current so as to produce a detection output signal.

Based on the depiction above, the capacitive touching apparatus provided by the invention does not use an integrator circuit to detect the capacitance variation, but uses the voltage variation produced by the equivalent capacitor module during the falling of the driving signal by detection to serve as the base for judging the capacitance variation amount of the capacitive touching apparatus. In addition, the invention also provides a self-contained detection method of capacitance variation, which effectively eliminates the effect of the offset voltage in the operation amplifier.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
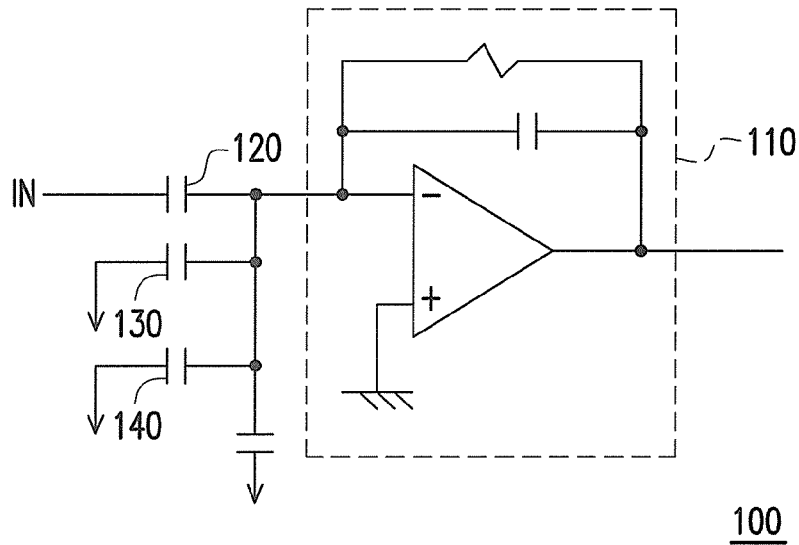
FIG. 1 is a circuit diagram of a conventional capacitive touching apparatus 100.
Figure 2:
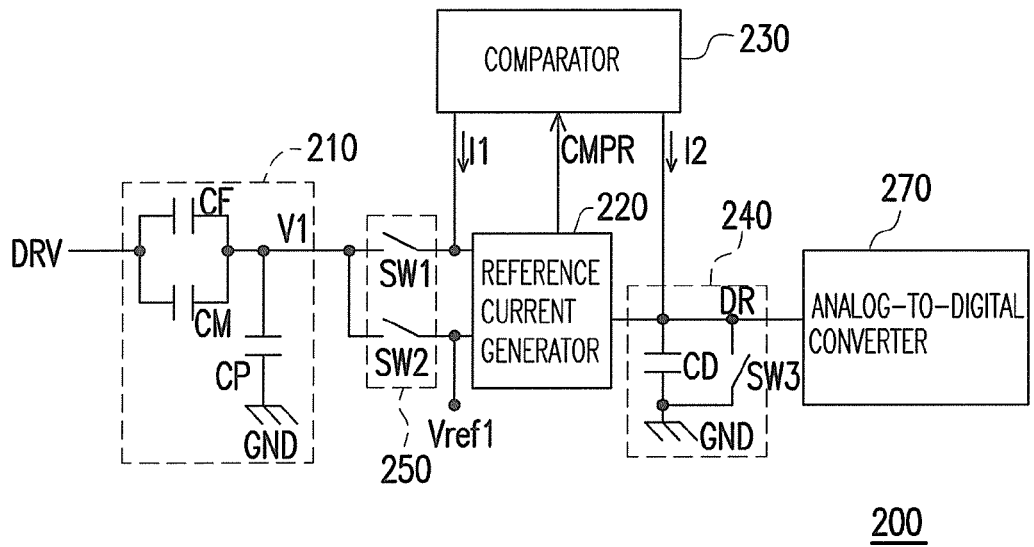
FIG. 2 is a diagram of a capacitive touching apparatus 200 according to an embodiment of the invention.

FIG. 2 is a diagram of a capacitive touching apparatus 200 according to an embodiment of the invention. Referring to FIG. 2, the capacitive touching apparatus 200 includes at least an equivalent capacitor module 210, a comparator 220, a reference current generator 230, a detection capacitor module 240, a selection switch module 250 and an analog-to-digital converter 270. The first terminal of the equivalent capacitor module 210 receives a periodic driving signal DRV and produces an output voltage V1 at the second terminal of the equivalent capacitor module 210 according to the driving signal DRV. The equivalent capacitor module 210 includes a mutual inductance capacitor CM, a touch capacitor CF and a parasitic capacitor CP therein. The mutual inductance capacitor CM is connected in series at the first terminal and the second terminal of the equivalent capacitor module 210. The touch capacitor CF and the mutual inductance capacitor CM are connected in parallel to each other so as to provide a negative capacitance value during a touching event occurs. The parasitic capacitor CP is connected in series between the second terminal of the equivalent capacitor module 210 and a ground voltage GND.

The comparator 220 is coupled to the equivalent capacitor module 210 and receives the output voltage V1 through the selection switch module 250, and compares the output voltage V1 with a reference voltage Vref1 so as to produce a comparison result CMPR.

The reference current generator 230 is coupled to the comparator 220 and coupled to the equivalent capacitor module 210 and the detection capacitor module 240 through the selection switch module 250. The reference current generator 230 produces two reference currents I1 and I2 according to a base current. The reference current generator 230 receives the comparison result CMPR produced by the comparator 220 and decides whether to respectively output the reference currents I1 and I2 according to the comparison result CMPR, in which the reference current I1 is output to the second terminal of the equivalent capacitor module 210, and the reference current I2 is output to the detection capacitor module 240.

The detection capacitor module 240 produces a detection output signal DR according to the reference current I2. The analog-to-digital converter 270 receives a detection output signal DR and converts the analog detection output signal DR into the digital detection output signal DR. The selection switch module 250 includes two selection switches SW1 and SW2 therein for making the second terminal of the equivalent capacitor module 210 directly connected to the comparator 220 or directly receive a reference voltage Vref1 according to the driving signal DRV.

Figure 2A:
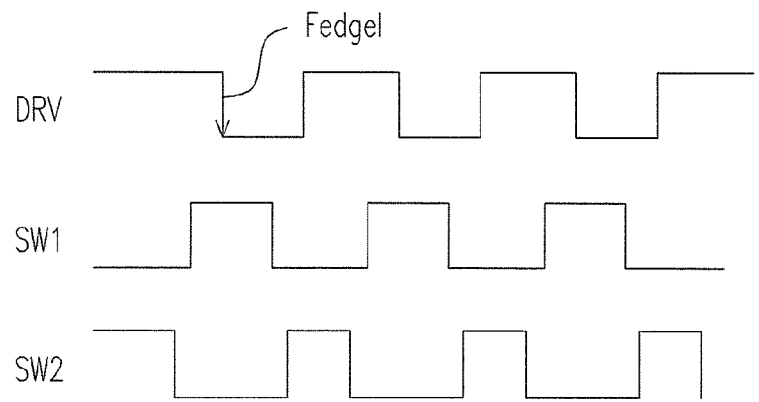
FIG. 2A is an operation wave diagram of the capacitive touching apparatus 200.

In terms of the overall operation of the capacitive touching apparatus 200, it needs referring to FIGS. 2 and 2A, in which FIG. 2A is an operation wave diagram of the capacitive touching apparatus 200. In order to detect the capacitance variation of the equivalent capacitor module 210, first, the selection switch SW2 is turned on and the selection switch SW1 is turned off to charge the parasitic capacitor CP by the reference voltage Vref1. Meanwhile, the reset switch SW3 in the detection capacitor module 240 is turned on to make a detection capacitor CD discharged. Next, right before the driving signal DRV falls from a high level to a falling edge Fedge 1 with a low level, the selection switch SW1 is turned on and the selection switch SW2 is turned off (at the time, the reset switch SW3 is turned off already) so that the output voltage V1 falls to be less than the reference voltage Vref1. In this way, the comparator 220 would produce a comparison result CMPR and makes the reference current I1 produced by the reference current generator 230 via the turned on selection switch SW1 to the second terminal of the equivalent capacitor module 210 through the comparison result CMPR, and transmits the reference current I2 produced by the reference current generator 230 to the detection capacitor module 240.

That is to say, when the output voltage V1 falls to be less than the reference voltage Vref1, the reference current I1 and the reference current I2 would respectively flow to the parasitic capacitor CP and the detection capacitor CD, so that the output voltage V1 rises to be equal to the reference voltage Vref1.

Since the reference currents I1 and I2 are produced by mirroring a same fundamental current, thus, the reference currents I1 and I2 have a specific ratio between them (for example, 1:1). Accordingly, the charge amount to make the output voltage V1 rise to be equal to the reference voltage Vref1 in the equivalent capacitor module 210 would be coupled into the detection capacitor CD with the specific ratio. The voltage on the detection capacitor CD is decided by the capacitance value summation of the mutual inductance capacitor CM and the touch capacitor CF and the ratio of the capacitance value summation over the capacitance value of the detection capacitor CD. In order to make the detection capacitor CD have a higher voltage value of the detection output signal DR, it can be obtained by using the driving signal DRV in many times and repeatedly switching the selection switches SW1 and SW2, or by increasing the ratio of the reference current I2 over the reference current I1.

Figure 2B:
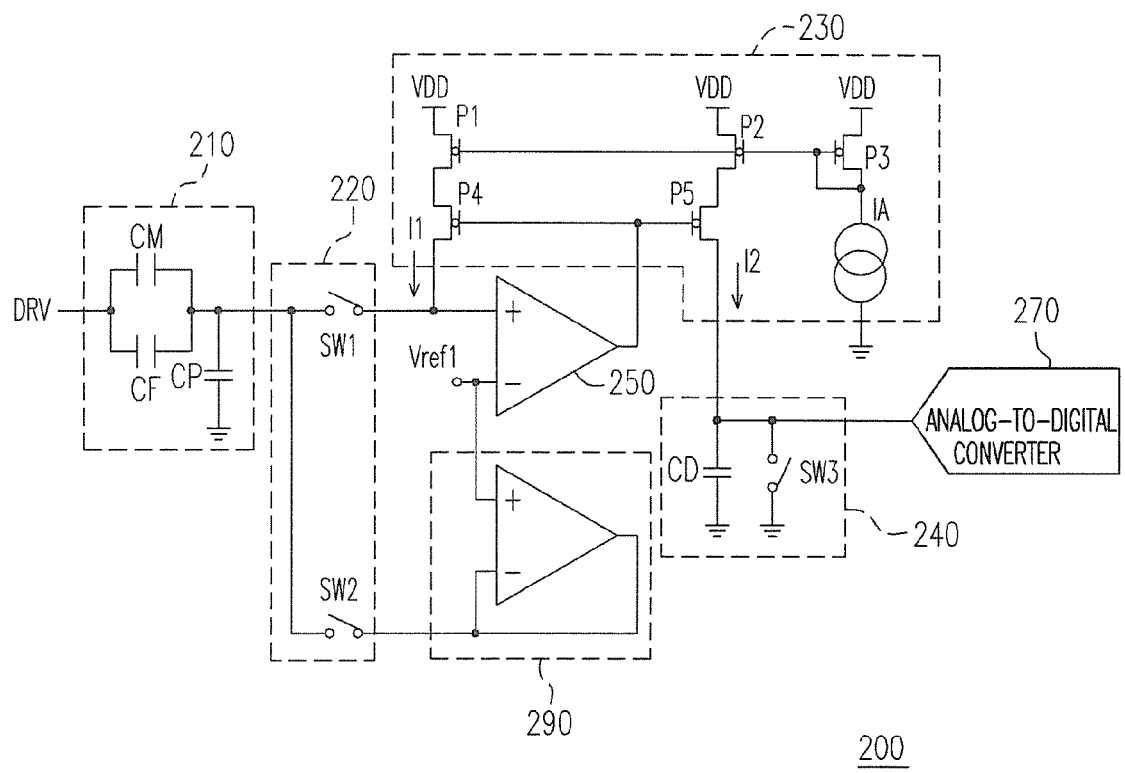
FIG. 2B is a diagram showing another implementation of the capacitive touching apparatus 200 of the invention.

FIG. 2B is a diagram showing another implementation of the capacitive touching apparatus 200 of the invention. Referring to FIG. 2B, the reference current generator 230 in the capacitive touching apparatus 200 in FIG. 2B includes a current mirror formed by transistors P1-P3 and a current source IA. The current source IA is for producing the fundamental current, and the current mirror formed by transistors P1-P3 mirrors the fundamental current to respectively produce the reference currents I1 and I2. The ratio of the reference current I1 over the reference current I2 herein can be obtained by adjusting the channel aspect ratios (ratio of channel width over channel length) of the transistors P1-P3, in which the transistors P1-P3 receive a power voltage VDD as a operation power.

In addition, the transistors P4 and P5 are current control switches for deciding whether the reference currents I1 and I2 are output, in which the gates of the transistors P4 and P5 together receive the comparison result CMPR and the transistors P4 and P5 are simultaneously turned on or off.

The comparator 250 is implemented by an operation amplifier, the operation amplifier has a first input terminal, a second input terminal and an output terminal. The output terminal produces the comparison result CMPR, and the first input terminal and the second input terminal respectively receive the reference current I1 and the reference voltage Vref1. The reference voltage Vref1 can be produced by a reference voltage generator (not shown) and is provided to the second input terminal of the comparator 250. The reference voltage Vref1 can also be directly provided to the equivalent capacitor module 210 or be provided to the equivalent capacitor module 210 through a single-gain buffer 290.

Figure 3:
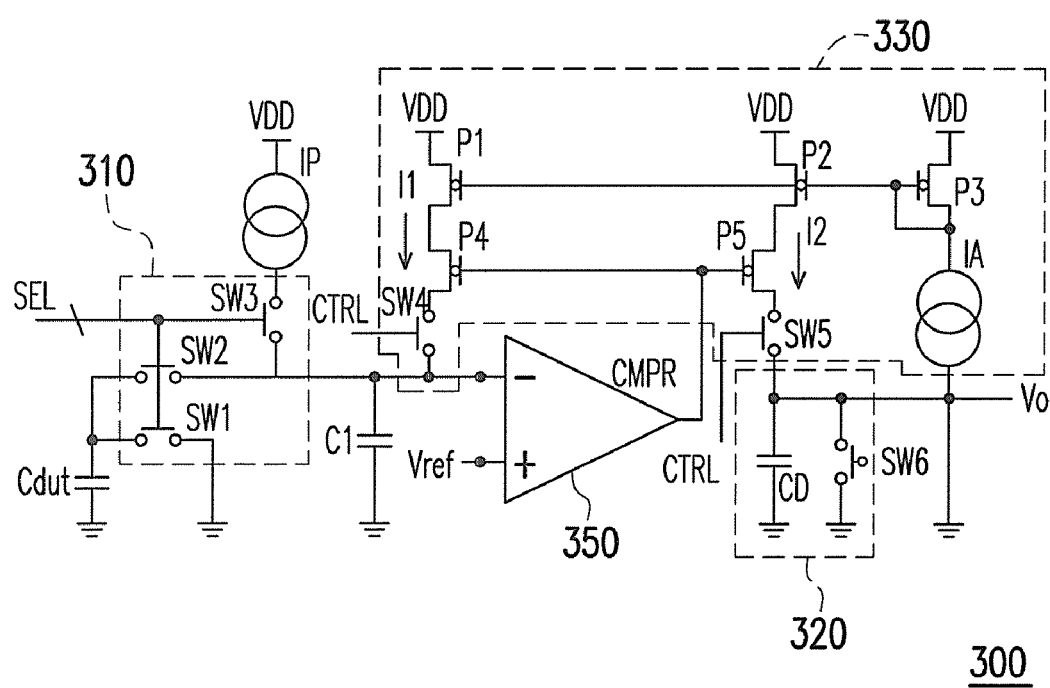
FIG. 3 is a diagram of a capacitive touching apparatus 300 according to another embodiment of the invention.

FIG. 3 is a diagram of a capacitive touching apparatus 300 according to another embodiment of the invention. Referring to FIG. 3, the capacitive touching apparatus 300 includes a touch capacitor Cdut, a charging current source IP, a capacitor C1, a selection switch module 310, a comparator 350, a reference current generator 330 and a detection capacitor module 320. The charging current source IP is for providing a charging current. The selection switch module 310, according to a selection signal SEL, makes the capacitor C1 charged by the charging current, makes the touch capacitor Cdut coupled to the ground voltage GND for discharging or makes the capacitor C1 coupled to the touch capacitor Cdut to assign charges. The comparator 350 is coupled to the capacitor C1 and the selection switch module 310. The comparator 350 makes the result of assigning charge between the capacitor C1 and the touch capacitor Cdut compared with the reference voltage Vref so as to produce the comparison result CMPR.

The reference current generator 330 is coupled to the comparator 350 and the capacitor C1 so as to produce the reference currents I1 and I2 according to the base current. The reference current generator 330 decides whether to respectively output the reference currents I1 and I2 according to the comparison result CMPR and the control signal CTRL, in which the reference current I1 is output to the capacitor C1 and the reference current I2 is output to the detection capacitor module 320. The detection capacitor module 320 receives the reference current I2 to correspondingly produce a detection output signal Vo.

The selection switch module 310 includes selection switches SW1-SW3. The selection switch SW1 is connected in series between the touch capacitor Cdut and the ground voltage GND. A terminal of the selection switch SW2 is coupled to the touch capacitor Cdut and the selection switch SW1 and another terminal thereof is coupled to the capacitor C1.

The reference current generator 330 includes a current source IA to produce the base current, a current mirror formed by transistors P1-P3, a current control switch module formed by transistors P4 and P5 and another current control switch module formed by switches SW4 and SW5. The current mirror formed by the transistors P1-P3 produces the reference currents I1 and I2 according to the mirrored base current. The current control switch module formed by the transistors P4 and P5 and the current control switch module formed by the switches SW4 and SW5 are coupled at the current mirror and between the capacitor C1 and the detection capacitor module 320 so as to respectively turn on or off the flowing paths of the reference currents I1 and I2 according to the comparison result CMPR and the control signal CTRL.

The detection capacitor module 320 includes a detection capacitor CD and a reset switch SW6. The detection capacitor CD is coupled to the reference current generator 330 to receive the reference current I2. The reset switch SW6 and the detection capacitor CD are connected in parallel to each other for being turned on to provide the detection capacitor CD with a discharging path according to the detection initial signal.

In terms of the overall operation of the capacitive touching apparatus 300, when the capacitive touching apparatus 300 has not a touching event occurred, first, the reference voltage Vref is set to be equal to the power voltage VDD received by the capacitive touching apparatus 300. Next, the selection switches SW1 and SW3 and the reset switch SW6 are turned on and the selection switch SW2 and the switches SW4 and SW5 are turned off. At the time, the charges in the detection capacitor CD are discharged, and the capacitor C1 is charged according to the charging current source IP. When the charges in the detection capacitor CD are discharged completely, the reset switch SW6 is turned off. After that, the selection switches SW1 and SW2 are repeatedly turned on and off according to a specific frequency, so that the charging current provided by the charging current source IP and the leakage current of the touch capacitor Cdut can be balanced by each other.

Further, the selection switches SW2 and SW3 are turned off and the switches SW4 and SW5 are turned on and at the time, the voltage level of the detection output signal Vo is tested. If the voltage level of the detection output signal Vo tested at the time is not 0V, the reference voltage Vref is accordingly adjusted to be lower so that the voltage level of the detection output signal Vo is equal to 0V.

After making the voltage level of the detection output signal Vo equal to 0V, the capacitive touching apparatus 300 has completed an initial correction operation, that is, after that, the capacitive touching apparatus 300 can accept the touching event of the user, and can effectively detect the occurring status of the touching event of the user.

When the touching event of the capacitive touching apparatus 300 occurs, the voltage value of the reference voltage Vref set before is kept and the selection switch SW3 is turned on and the switches SW4 and SW5 are turned off, and the reset switch SW6 is turned on to clear the charges in the detection capacitor CD. After the charges in the detection capacitor CD are cleared completely, the reset switch SW6 is turned off. Then, the selection switches SW1 and SW2 are turned on or off with the above-mentioned specific frequency, so that the charging current provided by the charging current source IP and the leakage current of the touch capacitor Cdut can be balanced by each other. After that, the selection switches SW2 and SW3 are turned off and the switches SW4 and SW5 are turned on, which makes the reference currents I1 and I2 respectively flow to the capacitor C1 and the detection capacitor CD according to the comparison result CMPR.

It should be noted that since the capacitance value of the touch capacitor Cdut is changed after a touching event occurs, so that, at the time to detect the touching event, the voltage at the terminal of the comparator 350 coupled by the capacitor C1 is different from the reference voltage Vref, which makes the comparator 350 produces the comparison result CMPR to turn on the current control switch module formed by transistors P4 and P5 and further charges the capacitor C1 and the detection capacitor CD respectively by the reference currents I1 and I2. After the detection capacitor CD is charged by the reference current I2, the detection capacitor CD produces the detection output signal Vo with a non-zero volt. Finally, the occurring status of the touching event of the capacitive touching apparatus 300 can be detected according to the detection output signal Vo with a non-zero volt.

In addition, if the voltage value of the detection output signal Vo wants to be increased, the switches SW4 and SW5 are turned off again and the selection switch SW3 is turned on. Then, the step is repeatedly conducted that "the selection switches SW1 and SW2 are turned on and off according to a specific frequency, so that the charging current provided by the charging current source IP and the leakage current of the touch capacitor Cdut can be balanced by each other. Then, the selection switches SW2 and SW3 are turned off and the switches SW4 and SW5 are turned on so that the reference currents I1 and I2 respectively flow to the capacitor C1 and the detection capacitor CD according to the comparison result CMPR", which further increases the voltage value of the detection output signal Vo to benefit the detection action of the touching event of the capacitive touching apparatus 300.

Figure 4:
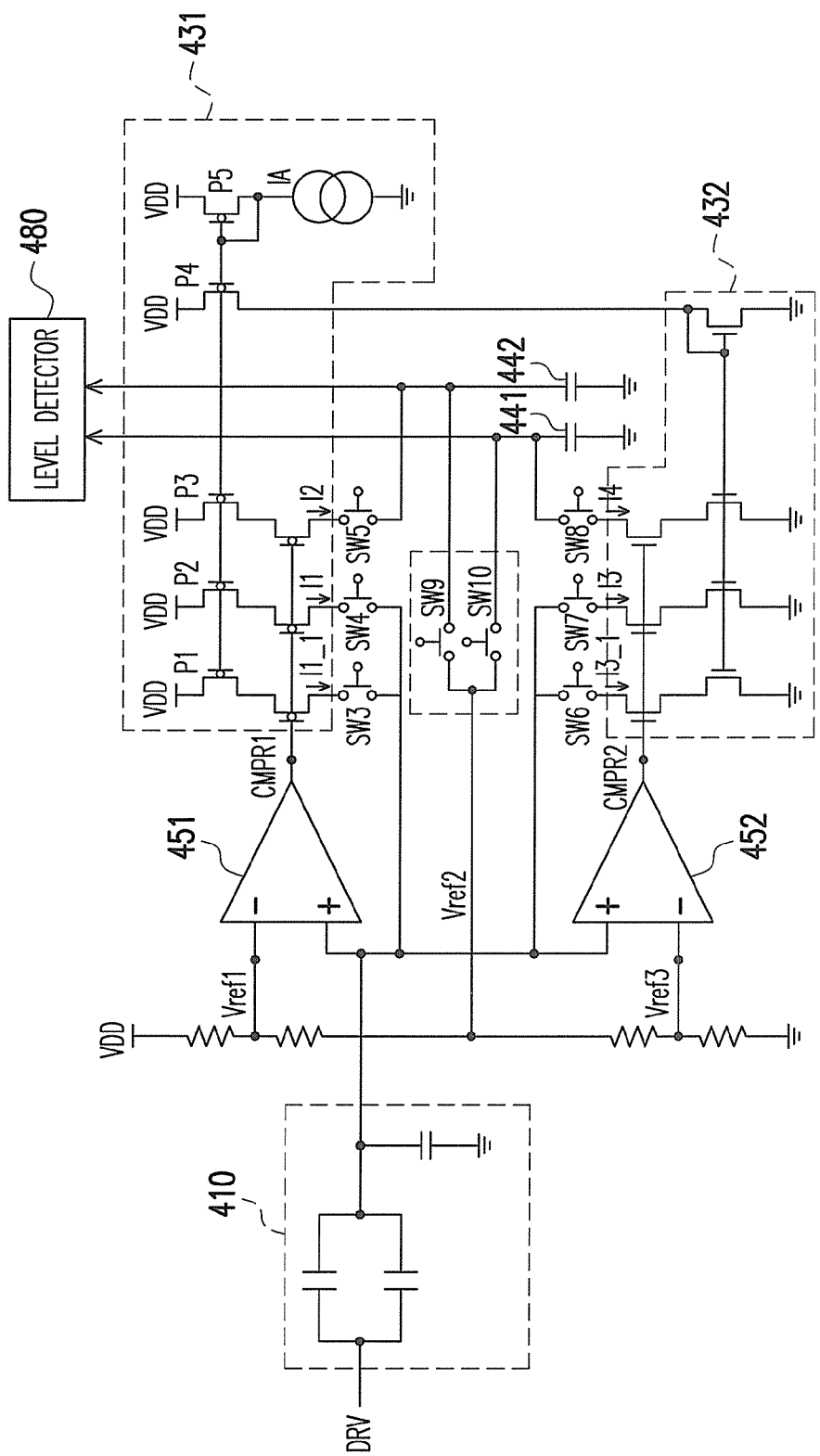
FIG. 4 is a diagram of a capacitive touching apparatus 400 according to yet another embodiment of the invention.

FIG. 4 is a diagram of a capacitive touching apparatus 400 according to yet another embodiment of the invention. Referring to FIG. 4, the capacitive touching apparatus 400 includes an equivalent capacitor module 410, comparators 451 and 452, reference current generators 431 and 432, detection capacitor modules 441 and 442, an equalizing switch module 420 and a level detector 480.

In terms of the operation of the capacitive touching apparatus 400, when the driving voltage DRV is at a high-level, the switches SW5, SW6, SW7 and SW8 are turned off, the switches SW3, SW4, SW9 and SW10 are turned on. At the time, the detection capacitor modules 441 and 442 are charged by the reference voltage Vref2. After the detection capacitor modules 441 and 442 are charged to be the reference voltage Vref2, the switches SW9 and SW10 are turned off. Then, the switches SW3 and SW4 are turned off, followed by turning on the switches SW6 and SW7, after that, the switches SW3 and SW4 and the switches SW6 and SW7 are alternately turned off and on so that the output voltage falls in an operation offset voltage range (equal to the reference voltage Vref1) according to the charging of the reference currents I1_1 and I1 or the discharging of the reference currents I3_1 and I3, and the switches SW6 and SW7 keep the turned off status and the switches SW3 and SW4 keep the turned on status, followed by turning off the switch SW3 and turning on the switch SW5.

After finishing the above-mentioned operations, it is waited that the driving voltage DRV transits from the high-level to the low-level. Meanwhile, the comparator 451 starts working and produces a comparison result CMPR1 to make the reference current I1 flow to the equivalent capacitor module 410 and the reference current I2 flow to the detection capacitor module 442 and pull up the voltage level on the detection capacitor module 442.

After the comparator 451 finishes the above-mentioned operations, the switches SW4 and SW5 are turned off and the switches SW6 and SW7 are turned on to make the output voltage fall to be equal to a reference voltage Vref3. When the output voltage falls to be equal to the reference voltage Vref3, the switch SW6 is turned off and the switch SW8 is turned on so that the driving voltage DRV is transiting from the low-level to the high-level. Once the driving voltage DRV has transited from the low-level to the high-level, the comparator 452 starts work and produces a comparison result CMPR2 to make the reference currents I3 and I4 respectively flow out from the equivalent capacitor module 410 and the detection capacitor module 441 and pull down the voltage level on the detection capacitor module 441.

After the driving voltage DRV finishes a transition cycle, the level detector 480 can judge the touching status of the capacitive touching apparatus 400 according to the voltage level difference between the detection capacitor modules 441 and 442.

If a more accurate judgement of the level detector 480 is wanted, the transition of the driving voltage DRV can be repeated in many cycles, followed by judging the voltage level difference between the detection capacitor modules 441 and 442. At the time, after the discharging and the charging of the voltages of the detection capacitor modules 441 and 442 are conducted in more times, the voltage level difference thereof is larger, which is more easily judged.

The reference voltages Vref1-Vref3 in the capacitive touching apparatus 400 of the embodiment of the invention can be produced by using a resistor chain to divide voltage on the power voltage VDD. In the embodiment, the reference voltage Vref1>reference voltage Vref2>reference voltage Vref3.

Figure 5:
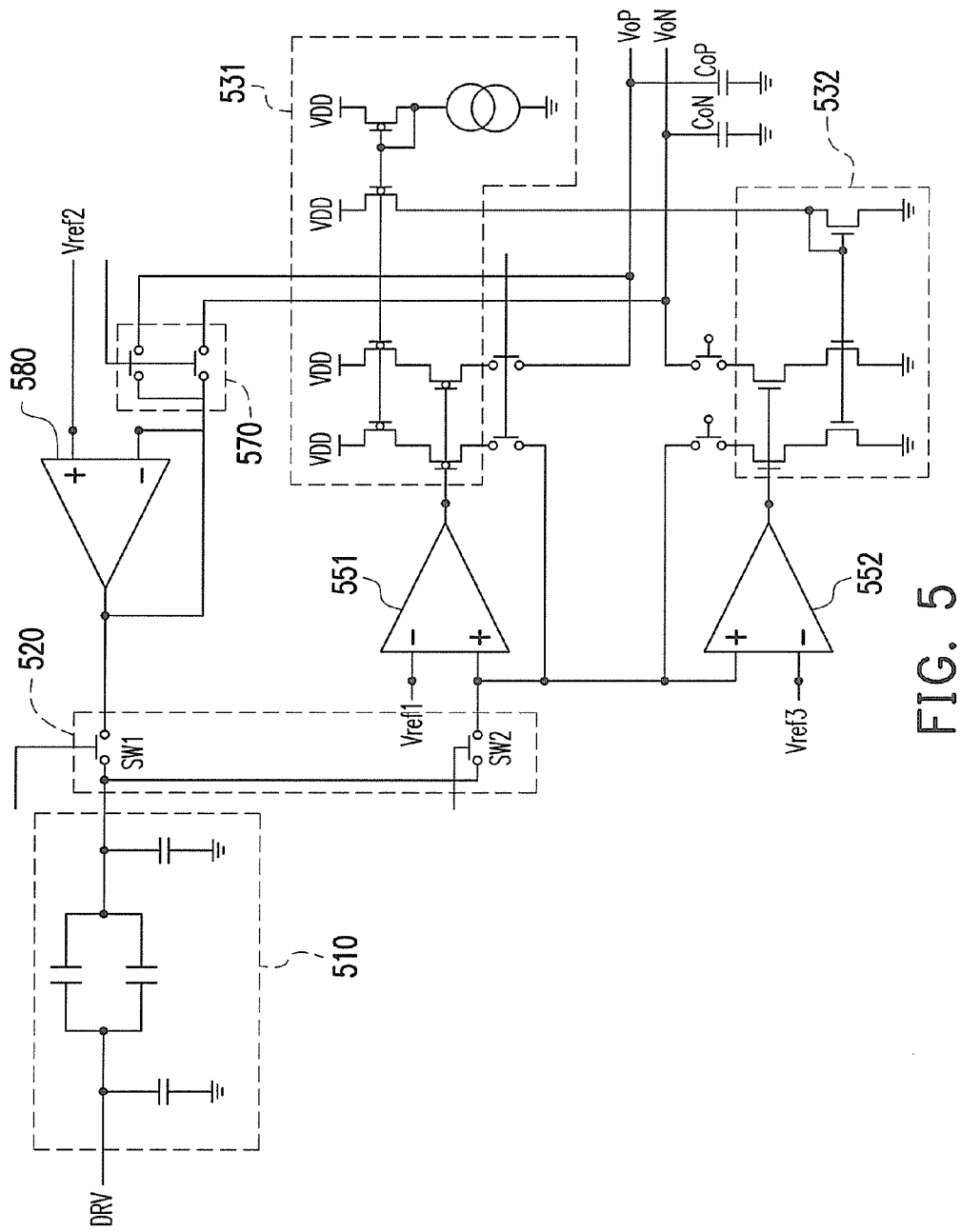
FIG. 5 is a diagram of a capacitive touching apparatus 500 according to yet another embodiment of the invention.

FIG. 5 is a diagram of a capacitive touching apparatus 500 according to yet another embodiment of the invention. Referring to FIG. 5, the capacitive touching apparatus 500 includes an equivalent capacitor module 510, a selection switch module 520, comparators 551 and 552, reference current generators 531 and 532, detection capacitor modules CoP and CoN, a single-gain buffer 580 and an equalizing switch module 570. The major difference of the capacitive touching apparatus 500 from the capacitive touching apparatus 400 of the above-mentioned embodiment rests in that the capacitive touching apparatus 500 employs the selection switch module 520 and the single-gain buffer 580 for detecting the equalizing actions of the detection capacitor modules CoP and CoN. When the selection switch SW1 is turned on, the selection switch module 520 provides the reference voltage Vref2 to the equivalent capacitor module 510 through the single-gain buffer 580; when the selection switch SW2 is turned on, the selection switch module 520 makes the reference current provided by the reference current generator 531 or 532 flow through the equivalent capacitor module 510. In terms of conducting the equalizing action by providing the reference voltage Vref2 to the detection capacitor modules CoP and CoN, the embodiment further provides the reference voltage Vref2 through the single-gain buffer 580 so as to increase the stability of the equivalent action.

The operation details of the capacitive touching apparatus 500 in the embodiment are similar to the capacitive touching apparatus 400 of the last embodiment, which is omitted to describe.

In summary, the invention detects the capacitance variation of the equivalent capacitor module in the capacitive touching apparatus according to the alternate transitions between the high-level and the low-level of the periodic driving signal, and makes the charge variation produced by the capacitance variation coupled into the detection capacitor module. In this way, the touching status of the capacitive touching apparatus can be obtained by the voltage of the detection capacitor module. In addition, the invention further provide a design that the reference voltage is set according to the touch capacitor of the capacitive touching apparatus at the status without touching, and the capacitance variation of the touch capacitor when the capacitive touching apparatus is touched can be detected according to the reference voltage.

It will be apparent to those skilled in the art that the descriptions above are several preferred embodiments of the invention only, which does not limit the implementing range of the invention. Various modifications and variations can be made to the structure of the invention without departing from the scope or spirit of the invention.

What is claimed is:

1. A capacitive touching apparatus, comprising:
   at least an equivalent capacitor module, having a first terminal and a second terminal, wherein the first terminal receives a periodic driving signal and an output voltage is produced at the second terminal of the equivalent capacitor module according to the driving signal;
   a first comparator, coupled to the equivalent capacitor module, receiving the output voltage and comparing the output voltage with a first reference voltage so as to produce a first comparison result;
   a first reference current generator, coupled to the equivalent capacitor module and the first comparator and producing a first reference current and a second reference current according to a base current, wherein the first reference current generator decides whether to respectively output the first reference current and the second reference current according to the first comparison result, and the first reference current is output to the second terminal of the equivalent capacitor module; and
   a first detection capacitor module, coupled to the first reference current generator to receive the second reference current and to thereby produce a first detection output signal.

2. The capacitive touching apparatus as claimed in claim 1, further comprising:
   a selection switch module, making the second terminal of the equivalent capacitor module connected to the first comparator or receiving a second reference voltage according to the driving signal.

3. The capacitive touching apparatus as claimed in claim 2, wherein the selection switch module comprises:

a first selection switch, connected in series between the equivalent capacitor module and the first comparator; and a second selection switch, connected in series between the equivalent capacitor module and the second reference voltage, wherein the turning on status or the turning off status of the first selection switch and the turning off status or the turning on status of the second selection switch are complementary to each other.

4. The capacitive touching apparatus as claimed in claim 2, wherein the falling edge of the driving signal occurs at the time that the selection switch module makes the second terminal of the equivalent capacitor module connected to the first comparator, and the rising edge of the driving signal occurs at the time that the selection switch module makes the second terminal of the equivalent capacitor module receive the second reference voltage.

5. The capacitive touching apparatus as claimed in claim 1, wherein the first reference current generator comprises:

a current source for producing the base current;

a current mirror, coupled to the current source, and receiving and mirroring the base current so as to produce the first reference current and the second reference current;

a first current control switch, coupled between the current mirror and the first comparator and turned on or turned off according to the first comparison result; and a second current control switch, coupled between the current mirror and the first detection capacitor module and turned on or turned off according to the first comparison result.

6. The capacitive touching apparatus as claimed in claim 1, wherein the first detection capacitor module comprises:

a detection capacitor, coupled to the first reference current generator to receive the second reference current; and a reset switch, connected in parallel to the detection capacitor for providing a discharging path of the detection capacitor when the reset switch is turned on.

7. The capacitive touching apparatus as claimed in claim 1, wherein the first comparator is an operation amplifier, the operation amplifier has a first input terminal, a second input terminal and an output terminal, the output terminal produces the comparison result, and the first input terminal and the second input terminal respectively receive the first reference current and the first reference voltage.

8. The capacitive touching apparatus as claimed in claim 1, wherein the equivalent capacitor module comprises:

a mutual inductance capacitor, connected in series between the first terminal and the second terminal of the equivalent capacitor module;

a touch capacitor, connected in parallel to the mutual inductance capacitor for providing a negative capacitance value; and a parasitic capacitor, connected in series between the second terminal of the equivalent capacitor module and a ground voltage.

9. The capacitive touching apparatus as claimed in claim 1, further comprising:

a reference voltage generator, coupled to the first comparator and the equivalent capacitor module for providing the first reference voltage and the second reference voltage.

10. The capacitive touching apparatus as claimed in claim 1, further comprising:

a single-gain buffer, coupled between the first comparator and the equivalent capacitor module and having an input terminal and an output terminal, wherein the input terminal thereof receives the first reference voltage and the output terminal is coupled to the equivalent capacitor module and produces the second reference voltage.

11. The capacitive touching apparatus as claimed in claim 1, further comprising:

an analog-to-digital converter, coupled to the first detection capacitor module so as to produce the digital detection output signal.

12. The capacitive touching apparatus as claimed in claim 1, further comprising:

a second comparator, coupled to the equivalent capacitor module, receiving the output voltage and comparing the output voltage with a third reference voltage to produce a second comparison result;

a second reference current generator, coupled to the equivalent capacitor module, the second comparator and the first reference current generator so as to produce a third reference current and a fourth reference current according to the base current, wherein the second reference current generator decides whether to respectively output the third reference current and the fourth reference current according to the second comparison result, and the third reference current is output to the second terminal of the equivalent capacitor module;

a second detection capacitor module, coupled to the second reference current generator to receive the fourth reference current and thereby to produce a second detection output signal; and a plurality of switch components, respectively connected in series at the first reference current generator to provide the first reference current and the second reference current between the equivalent capacitor module and the first detection capacitor module and at the second reference current generator to provide the third reference current and the fourth reference current between the equivalent capacitor module and the second detection capacitor module.

13. The capacitive touching apparatus as claimed in claim 12, further comprising:

a level detector, coupled to the first detection capacitor module and the second detection capacitor module, receiving a difference value between the first detection output signal and the second detection output signal and thereby obtaining the capacitance variation of the equivalent capacitor module according to the difference value between the first detection output signal and the second detection output signal.

14. The capacitive touching apparatus as claimed in claim 12, further comprising:

an equalizing switch module, coupled between the first detection capacitor module and the second detection capacitor module and the second reference voltage.

15. The capacitive touching apparatus as claimed in claim 14, further comprising:

a single-gain buffer, having an input terminal and an output terminal, wherein the input terminal receives a fourth reference voltage and the output terminal is coupled to the equalizing switch module.

16. The capacitive touching apparatus as claimed in claim 14, wherein the equalizing switch module comprises:

a first equalizing switch, connected in series between the output terminal of the single-gain buffer and the first detection capacitor; and a second equalizing switch, connected in series between the output terminal of the single-gain buffer and the second detection capacitor, wherein when the first equalizing switch and the second equalizing switch are turned on, the first detection capacitor and the second detection capacitor are charged to be equal to the voltage level of the fourth reference voltage.

17. A capacitive touching apparatus, comprising:
   at least a touch capacitor;
   a charging current source, providing a charging current;
   a first capacitor;
   a selection switch module, coupled between the touch capacitor and the charging current source for charging the first capacitor by using the charging current, making the touch capacitor coupled to a ground voltage so as to be discharged or making the first capacitor coupled to the touch capacitor for assigning charges according to a selection signal;
   a comparator, coupled to the first capacitor and the selection switch module and making the result of assigning charge between the first capacitor and the touch capacitor compared with a reference voltage so as to produce a comparison result;
   a reference current generator, coupled to the comparator and the first capacitor so as to produce a first reference current and a second reference current according to a base current, wherein the reference current generator decides whether to respectively output the first reference current and the second reference current according to the comparison result and a control signal, wherein the first reference current is output to the first capacitor; and
   a detection capacitor module, coupled to the reference current generator to receive the second reference current so as to produce a detection output signal.

18. The capacitive touching apparatus as claimed in claim 17, wherein the reference current generator comprises:
   a current source for producing the base current;
   a current mirror, coupled to the current source and receiving and mirroring the base current so as to produce the first reference current and the second reference current;
   a first selection switch module, coupled between the current mirror and the first capacitor and turned on or turned off according to the comparison result; and
   a second selection switch module, coupled at the current mirror and between the first capacitor and the detection capacitor module, and turned on or turned off according to the control signal.

19. The capacitive touching apparatus as claimed in claim 17, wherein the detection capacitor module comprises:
   a detection capacitor, coupled to the reference current generator to receive the second reference current; and
   a reset switch, connected in parallel to the detection capacitor for being turned on so as to provide a discharging path of the detection capacitor.

20. The capacitive touching apparatus as claimed in claim 17, wherein the selection switch module comprises:
   a first selection switch, connected in series between the touch capacitor and the ground voltage;
   a second selection switch, having a terminal and another terminal, wherein the terminal is coupled the touch capacitor and the first selection switch, and the other terminal is coupled to the first capacitor; and
   a third selection switch, connected in series between the first capacitor and the current source.

21. The capacitive touching apparatus as claimed in claim 17, further comprising:
   an analog-to-digital converter, coupled to the detection capacitor module so as to receive the analog detection output signal and thereby produce the digital detection output signal.

* * * * *